United States Patent
Nishi et al.

(10) Patent No.: US 8,684,596 B2
(45) Date of Patent: Apr. 1, 2014

(54) SECONDARY BATTERY TEMPERATURE-ESTIMATING APPARATUS AND METHOD

(75) Inventors: Yuji Nishi, Nagoya (JP); Hidenori Takahashi, Okazaki (JP); Masatoshi Tazawa, Okazaki (JP); Masanobu Matsusaka, Handa (JP); Keiji Kaita, Miyoshi (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 132 days.

(21) Appl. No.: 13/382,736

(22) PCT Filed: Jul. 7, 2010

(86) PCT No.: PCT/IB2010/001668
§ 371 (c)(1),
(2), (4) Date: Jan. 6, 2012

(87) PCT Pub. No.: WO2011/004249
PCT Pub. Date: Jan. 13, 2011

(65) Prior Publication Data
US 2012/0099618 A1    Apr. 26, 2012

(30) Foreign Application Priority Data
Jul. 8, 2009  (JP) .................................. 2009-161923

(51) Int. Cl.
*G01K 13/00*  (2006.01)
*G01K 1/00*   (2006.01)

(52) U.S. Cl.
USPC .......................................... 374/152; 374/141

(58) Field of Classification Search
USPC ................................................ 374/152, 141
See application file for complete search history.

(56) References Cited

U.S. PATENT DOCUMENTS 5,711,605 A * 1/1998 Reher et al. .................... 374/141
6,076,964 A * 6/2000 Wu et al. ........................ 374/141

(Continued)

FOREIGN PATENT DOCUMENTS

CN    1668933 A      9/2005
DE    102 08 651 A1  1/2003

(Continued)

OTHER PUBLICATIONS

Coleman M et al: "A combined SOC estimation method under varied ambient temperature for a lead-acid battery", Applied Power Electronics Conference and Exposition, 2005, APEC 2005, 20th Annual IEEE Austin, TX, USA, Mar. 6-10, 2005, Piscataway, NJ, USA, IEEE, US, vol. 2, Mar. 6, 2005, pp. 991-997.

(Continued)

*Primary Examiner* — Mirellys Jagan
(74) *Attorney, Agent, or Firm* — Sughrue Mion, PLLC

(57) ABSTRACT

An alternating current impedance-estimating section (106) estimates an alternating current impedance (Rh) of the secondary battery based on electric current (I) and voltage (V) of the secondary battery detected when a ripple generating section causes a ripple current to flow in the secondary battery. A temperature estimating section (108) estimates the temperature (T) of the secondary battery based on the alternating current impedance (Rh) estimated by the alternating current impedance-estimating section (106) with the use of the relation, obtained in advance, between the temperature (T) of the secondary battery and the alternating current impedance (Rh) of the secondary battery at a ripple frequency.

5 Claims, 11 Drawing Sheets

62B

(56) References Cited

U.S. PATENT DOCUMENTS

| | | | |
|---|---|---|---|
| 6,078,163 A | 6/2000 | Horie et al. | |
| 6,137,269 A | 10/2000 | Champlin | |
| 6,902,319 B2 * | 6/2005 | Wu et al. | 374/141 |
| 2005/0269991 A1 | 12/2005 | Mitsui et al. | |
| 2007/0120537 A1 | 5/2007 | Yamamoto | |
| 2007/0139017 A1 | 6/2007 | Marchand et al. | |
| 2012/0256752 A1 * | 10/2012 | Musser et al. | 340/636.2 |
| 2013/0108904 A1 * | 5/2013 | Okabayashi | 429/90 |

FOREIGN PATENT DOCUMENTS

| | | |
|---|---|---|
| EP | 1 548 453 A1 | 6/2005 |
| EP | 1 688 722 A1 | 8/2006 |
| EP | 1 933 159 A2 | 6/2008 |
| JP | 59-215674 A | 12/1984 |
| JP | 11-162526 A | 6/1999 |
| JP | 11-329516 A | 11/1999 |
| JP | 2006-006073 A | 1/2006 |
| JP | 2006-507790 A | 3/2006 |
| JP | 2008-175556 A | 7/2008 |
| WO | WO 96/29773 A2 | 9/1996 |
| WO | WO 98/22830 A2 | 5/1998 |
| WO | WO 2010/049795 A1 | 5/2010 |

OTHER PUBLICATIONS

Forgez C et al: "Thermal modeling of a cylindrical LiFePO4/graphite lithium-ion battery", Journal of Power Sources, Elsevier SA, CH, Vo. 195, No. 9, May 1, 2010, pp. 2961-2968, XP026827346, ISSN: 0378-7753.

Gross et al: "Heat generation in sealed batteries", Energy Conversion, vol. 9, No. 2, Jun. 1, 1969, pp. 55-62, XP025454375, ISSN: 0013-7480, DOI: DOI:10.1016/0013-7480(69)90103-X.

International Preliminary Report on Patentability for corresponding International Patent Application No. PCT/IB2010/001668 mailed Sep. 15, 2011.

International Search Report and Written Opinion for corresponding International Patent Application No. PCT/IB2010/001668 mailed Feb. 21, 2011.

Japanese Office Action for corresponding JP Patent Application No. 2009-161923 drafted Apr. 18, 2011.

* cited by examiner

SECONDARY BATTERY TEMPERATURE-ESTIMATING APPARATUS AND METHOD

BACKGROUND OF THE INVENTION

1. Field of the Invention

The invention relates to a secondary battery temperature-estimating apparatus for estimating a temperature of a secondary battery, and particularly to a technology for accurately estimating the temperature of the secondary battery without using a temperature sensor.

2. Description of the Related Art

In general, in secondary batteries, typified by lithium-ion batteries and nickel-hydrogen batteries, charging and discharging characteristics are degraded as the temperature decreases. When the temperature of the battery is low, it is required to quickly increase the temperature of the battery.

Japanese Patent Application Publication No. H11-329516 (JP-A-11-329516) describes an apparatus for increasing the temperature of a battery. In the temperature increasing apparatus, a resonance circuit is formed by connecting a series circuit consisting of an inductor, a capacitor, and an alternating-current power supply across the battery. The temperature of the battery is increased by making the alternating-current power supply generate an alternating current voltage at the resonance frequency of the resonance circuit.

In the temperature increasing apparatus, almost all the electric power is consumed in the internal resistance during resonance and the temperature of the battery is increased by self-heat generation. It is insisted that this temperature increasing apparatus is capable of effectively increasing the temperature of the battery with minimum electric power consumption (see JP-A-11-329516).

In order to increase the temperature of the secondary battery to a target temperature safely and accurately, it is important to accurately determine the temperature of the secondary battery. The temperature sensor however measures the temperature of the surface of the battery and therefore, the actual temperature of the inside of the battery is not accurately reflected on the result of the detection. In addition, using a temperature sensor leads to an increase of costs. JP-A-11-329516 merely discloses the technology for increasing the temperature of the battery and the above publication includes no teaching concerning the method of accurately estimating the temperature of the battery while the temperature of the battery is increased.

SUMMARY OF THE INVENTION

The invention provides a secondary battery temperature estimating apparatus capable of accurately estimating the temperature of a secondary battery without using a temperature sensor.

A secondary battery temperature-estimating apparatus according to a first aspect of the invention includes a ripple generating section, an electric current detecting section, a voltage detecting section, an impedance estimating section, and a temperature estimating section. The ripple generating section is connected to the secondary battery and adapted to cause a ripple current at a predetermined frequency to flow in the secondary battery. The electric current detecting section detects an electric current charging or discharging the secondary battery. The voltage detecting section detects a voltage of the secondary battery. The impedance estimating section estimates an impedance of the secondary battery based on the electric current detected by the electric current detecting section and the voltage detected by the voltage detecting section when the ripple generating section causes the ripple current to flow in the secondary battery. The temperature estimating section estimates the temperature of the secondary battery based on the impedance estimated by the impedance estimating section with the use of the relation, obtained in advance, between the temperature of the secondary battery and the impedance of the secondary battery.

In the first aspect, a configuration may be employed, in which the impedance estimating section estimates an alternating current impedance of the secondary battery at the predetermined frequency based on the electric current detected by the electric current detecting section and the voltage detected by the voltage detecting section when the ripple generating section causes the ripple current to flow in the secondary battery, and the temperature estimating section estimates the temperature of the secondary battery based on the alternating current impedance estimated by the impedance estimating section with the use of the relation, obtained in advance, between the temperature of the secondary battery and the alternating current impedance of the secondary battery at the predetermined frequency.

In the first aspect, a configuration may be employed, in which the impedance estimating section includes an offset electric current calculating section, an offset voltage calculating section, and a direct-current resistance estimating section. The offset electric current calculating section calculates an offset electric current represented by an average value of the detected electric current, based on the electric current detected by the electric current detecting section when the ripple generating section causes the ripple current to flow in the secondary battery. The offset voltage calculating section calculates an offset voltage that is a difference between an open-circuit voltage of the secondary battery and an average value of the detected voltage, based on the voltage detected by the voltage detecting section when the ripple generating section causes the ripple current to flow in the secondary battery. The direct-current resistance estimating section estimates a direct current resistance of the secondary battery based on the offset electric current and the offset voltage. The temperature estimating section estimates the temperature of the secondary battery based on the direct current resistance estimated by the direct-current resistance estimating section with the use of the relation, obtained in advance, between the temperature of the secondary battery and the direct current resistance of the secondary battery.

In the first aspect, each of the electric current detecting section and the voltage detecting section may include a peak value acquiring section that acquires a peak value of the detected value.

A secondary battery temperature-estimating apparatus according to a second aspect of the invention includes a ripple generating section, an electric current detecting section, a state of charge (SOC) estimating section, a loss estimating section, and a temperature estimating section. The ripple generating section is connected to the secondary battery and adapted to cause a ripple current at a predetermined frequency to flow in the secondary battery. The electric current detecting section detects an electric current charging or discharging the secondary battery. The SOC estimating section estimates an SOC of the secondary battery based on the electric current detected by the electric current detecting section. The loss estimating section estimates an energy loss of the secondary battery based on the SOC estimated when the ripple generating section causes the ripple current to flow in the secondary battery. The temperature estimating section estimates the amount of change in the temperature of the secondary battery based on the energy loss of the secondary battery estimated by the loss estimating section and estimates the temperature of the secondary battery based on the estimated amount of change in the temperature.

In the second aspect, the SOC estimating section may include an offset electric current calculating section, a discharge amount estimating section, and a change amount estimating section. The offset electric current calculating section calculates an offset electric current represented by an average value of the detected electric current, based on the electric current detected by the electric current detecting section when the ripple generating section causes the ripple current to flow in the secondary battery. The discharge amount estimating section estimates the amount of discharge from the secondary battery obtained by integrating the offset electric current. The change amount estimating section estimates the amount of change in the SOC of the secondary battery by dividing the amount of discharge from the secondary battery estimated by the discharge amount estimating section by a capacity of the secondary battery.

In the second aspect, the electric current detecting section may include a peak value acquiring section that acquires a peak value of the detected value.

A secondary battery temperature-estimating method according to a third aspect of the invention includes: causing a ripple current at a predetermined frequency to flow in the secondary battery; detecting an electric current charging or discharging the secondary battery; detecting a voltage of the secondary battery; estimating an impedance of the secondary battery based on the electric current and the voltage detected when the ripple current is caused to flow in the secondary battery; and estimating the temperature of the secondary battery based on the estimated impedance with the use of the relation, obtained in advance, between the temperature of the secondary battery and the impedance of the secondary battery.

In the third aspect, a mode may be employed, in which, in estimating the impedance, an alternating current impedance of the secondary battery at the predetermined frequency is estimated based on the electric current and the voltage detected when the ripple current is caused to flow in the secondary battery, and in estimating the temperature, the temperature of the secondary battery is estimated based on the estimated alternating current impedance with the use of the relation, obtained in advance, between the temperature of the secondary battery and the alternating current impedance of the secondary battery at the predetermined frequency.

In the third aspect, a mode may be employed, in which estimating the impedance includes: calculating an offset electric current represented by an average value of the detected electric current, based on the electric current detected when the ripple current is caused to flow in the secondary battery; calculating an offset voltage that is a difference between an open-circuit voltage of the secondary battery and an average value of the detected voltage, based on the voltage detected when the ripple current is caused to flow in the secondary battery; and estimating a direct current resistance of the secondary battery based on the offset electric current and the offset voltage, and in estimating the temperature, the temperature of the secondary battery is estimated based on the estimated direct current resistance with the use of the relation, obtained in advance, between the temperature of the secondary battery and the direct current resistance of the secondary battery.

A secondary battery temperature-estimating method according to a fourth aspect of the invention includes: causing a ripple current at a predetermined frequency to flow in the secondary battery; detecting an electric current charging or discharging the secondary battery; estimating a state of charge (SOC) of the secondary battery based on the detected electric current; estimating an energy loss of the secondary battery based on the SOC estimated when the ripple current is caused to flow in the secondary battery; and estimating the amount of change in the temperature of the secondary battery based on the estimated energy loss of the secondary battery and estimating the temperature of the secondary battery based on the estimated amount of change in the temperature.

In the fourth aspect, the estimating the SOC may include: calculating an offset electric current represented by an average value of the detected electric current, based on the electric current detected when the ripple current is caused to flow in the secondary battery; estimating the amount of discharge from the secondary battery obtained by integrating the offset electric current; and estimating the amount of change in the SOC of the secondary battery by dividing the estimated amount of discharge from the secondary battery by a capacity of the secondary battery.

In the invention, the temperature of a secondary battery is increased by causing a ripple current at a predetermined frequency to flow in the secondary battery. The impedance of the secondary battery is estimated based on the electric current and the voltage of the secondary battery detected when the ripple current is caused to flow in the secondary battery. The temperature of the secondary battery is estimated based on the estimated impedance with the use of the relation, obtained in advance, between the temperature of the secondary battery and the impedance of the secondary battery.

In the invention, the SOC of the secondary battery is estimated based on the detected electric current and the energy loss of the secondary battery is estimated based on the SOC estimated when the ripple current is caused to flow in the secondary battery. The amount of change in the temperature of the secondary battery is then estimated based on the estimated energy loss and the temperature of the secondary battery is estimated based on the estimated amount of change in the temperature.

Thus, according to the invention, it is possible to accurately estimate the temperature of the secondary battery without using a temperature sensor.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
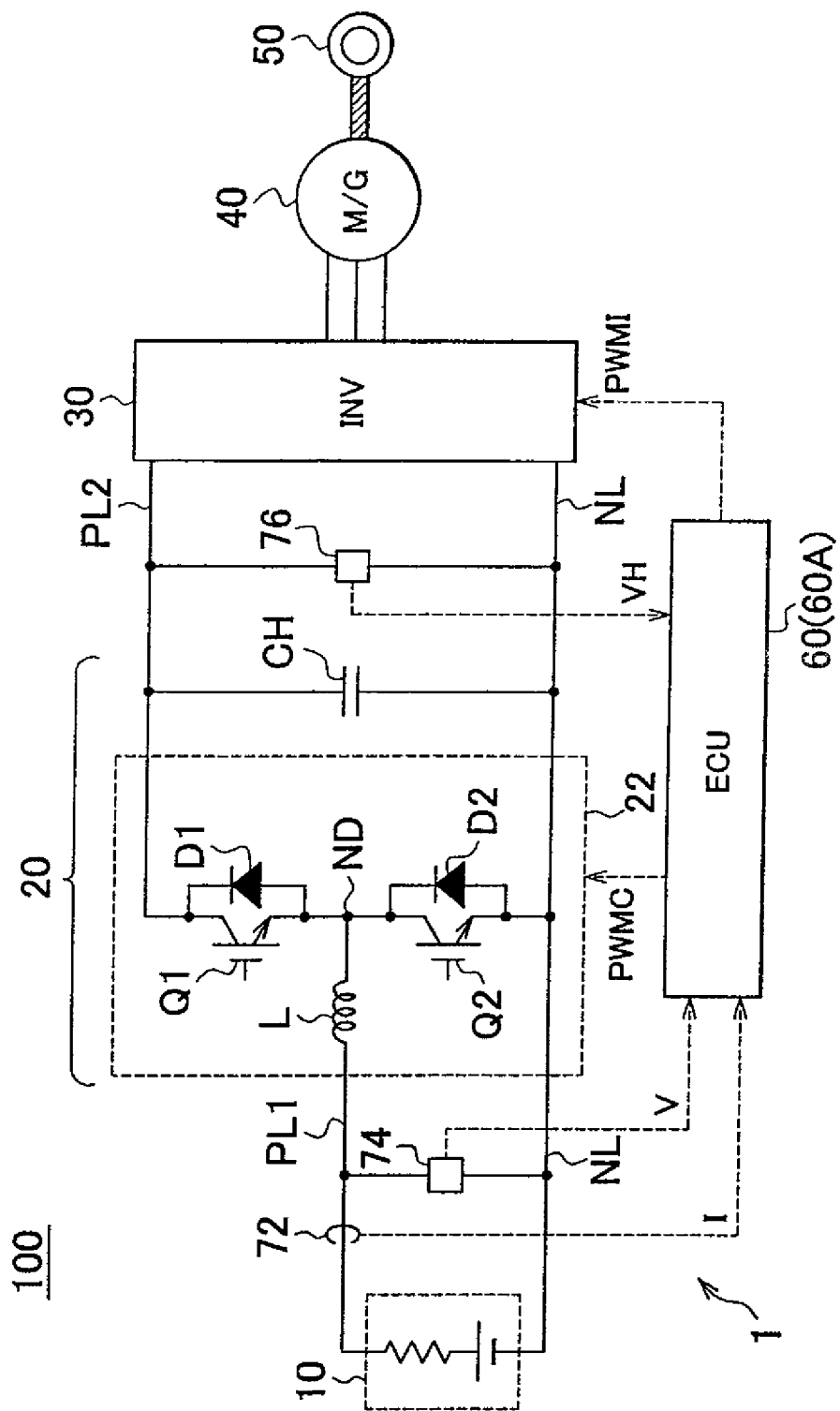
FIG. 1 is a block diagram of the whole of an electric vehicle that is given as an application example of a secondary battery temperature-estimating apparatus according to a first embodiment of the invention.

Embodiments of the invention will be described in detail below with reference to drawings. Note that the same or the corresponding portions in the drawings are designated by the same reference numeral and the description thereof is not repeated.

(First Embodiment)

FIG. 1 is a block diagram of the whole of an electric vehicle that is given as an application example of a secondary battery temperature-estimating apparatus for a secondary battery according to a first embodiment of the invention. Referring to FIG. 1, the electric vehicle 100 includes the secondary battery 10, a boost converter 22, a capacitor CH, an inverter 30, a motor generator 40, and a driving wheel 50. The electric vehicle 100 further includes an electronic control unit (ECU) 60, an electric current sensor 72, and voltage sensors 74 and 76.

The secondary battery 10 is a rechargeable battery, typified by a lithium ion battery or a nickel-hydrogen battery. A positive terminal and a negative terminal of the secondary battery 10 are connected to a positive line PL1 and a negative line NL, respectively.

The boost converter 22 includes power semiconductor switching devices (hereinafter also referred to merely as "the switching devices") Q1 and Q2, diodes D1 and D2, and a reactor L. The switching devices Q1 and Q2 are connected in series between a positive line PL2 and the negative line NL. A collector of the switching device Q1 is connected to the positive line PL2 and an emitter of the switching device Q2 is connected to the negative line NL. The diodes D1 and D2 are connected in anti-parallel to the switching devices Q1 and Q2, respectively. One terminal of the reactor L is connected to the positive line PL1 and the other terminal thereof is connected to a node ND between the switching devices Q1 and Q2.

As the above switching devices Q1 and Q2, insulated gate bipolar transistors (IGBTs), power metal oxide semiconductor (MOS) transistors, etc. can be used, for example.

The boost converter 22 can boost the voltage between the positive line PL2 and the negative line NL (hereinafter also referred to as "the system voltage") to or above the output voltage of the secondary battery 10, based on a control signal PWMC from the ECU 60. When the system voltage is lower than the desired voltage, by increasing the duty factor of the switching device Q2, an electric current is caused to flow from the positive line PL1 to the positive line PL2, so that it is possible to raise the system voltage. Meanwhile, when the system voltage is higher than the desired voltage, by increasing the duty factor of the switching device Q1, an electric current is caused to flow from the positive line PL2 to the positive line PL1, so that it is possible to reduce the system voltage.

The boost converter 22 and the capacitor CH form a ripple generating section 20 to be described later. The boost converter 22 causes a ripple current at a predetermined frequency to flow in the secondary battery 10 based on the control signal PWMC from the ECU 60, thereby increasing the temperature of the secondary battery 10 from its inside (such an operation for increasing temperature is hereinafter also referred to as "the ripple temperature increase operation"). Specifically, in the boost converter 22, the switching devices Q1 and Q2 are complementarily turned on and off according to the control signal PWMC from the ECU 60, whereby the boost converter 22 causes a ripple current to flow in the secondary battery 10 depending on the switching frequency of the switching devices Q1 and Q2. The ripple temperature increase operation will be described in detail later.

The capacitor CH is connected between the positive line PL2 and the negative line NL to smooth the voltage between the positive line PL2 and the negative line NL. The capacitor CH is used as an electric power buffer that temporarily stores the electric power output from the secondary battery 10 when the ripple temperature increase operation on the secondary battery 10 is performed.

The inverter 30 converts the direct-current power supplied from the positive line PL2 and the negative line NL into three-phase alternating current based on the control signal PWMI from the ECU 60 and outputs the three-phase alternating current to the motor generator 40 to drive the motor generator 40. The inverter 30 converts the three-phase alternating current generated by the motor generator 40 into a direct current based on the control signal PWMI to output the direct current to the positive line PL2 and the negative line NL during braking of the vehicle.

The motor generator 40 is an alternating current motor, which is, for example, a three-phase alternating current motor provided with a rotor, in which permanent magnets are embedded. The motor generator 40 is mechanically connected to the driving wheel 50 and generates the torque for driving the vehicle. In addition, the motor generator 40 receives the kinetic energy of the vehicle from the driving wheel 50 to generate electricity during braking of the vehicle.

The electric current sensor 72 detects an electric current I input and output to and from the secondary battery 10 and the detected value is output to the ECU 60. The sign of the electric current I is hereinafter positive when the electric current I flows in the direction such that the secondary battery 10 is charged. The electric voltage sensor 74 detects an electric voltage V between the positive line PL1 and the negative line NL that corresponds to the output voltage of the secondary battery 10, and outputs the detected value to the ECU 60. The voltage sensor 76 detects a voltage VH between the positive line PL2 and the negative line NL and outputs the detected value to the ECU 60.

The ECU 60 generates a pulse width modulation (PWM) signal for driving the boost converter 22 based on the detected values of the voltages V and VH supplied from the voltage sensors 74 and 76, respectively. The generated PWM signals are output to the boost converter 22 as the control signal PWMC.

When predetermined conditions for performing the ripple temperature increase operation on the secondary battery 10 are satisfied, the ECU 60 generates the control signal PWMC for causing a ripple current at a predetermined frequency to flow in the secondary battery 10 and the generated control signal PWMC is output to the boost converter 22. As an example, the ECU 60 sets the frequency of the carrier signal to the predetermined frequency (hereinafter also referred to as "the ripple frequency") and generates the control signal PWMC for turning on and off the switching devices Q1 and Q2 of the boost converter 22 at the ripple frequency.

In addition, the ECU 60 estimates the temperature of the secondary battery 10 based on the value of the electric current I detected by and supplied from the electric current sensor 72 and the value of the voltage V detected by and supplied from the voltage sensor 74 when the ripple current is caused to flow in the secondary battery 10.

The ripple temperature increase operation on the secondary battery 10 by the ripple generating section 20 formed of the boost converter 22 and the capacitor CH and a method of estimating the temperature of the secondary battery 10 based on the detected values of the electric current I and the voltage V during the ripple temperature increase operation, will be described in detail later.

The ECU 60 generates the control signal PWMI for driving the motor generator 40 and outputs the generated control signal PWMI to the inverter 30.

Figure 2:
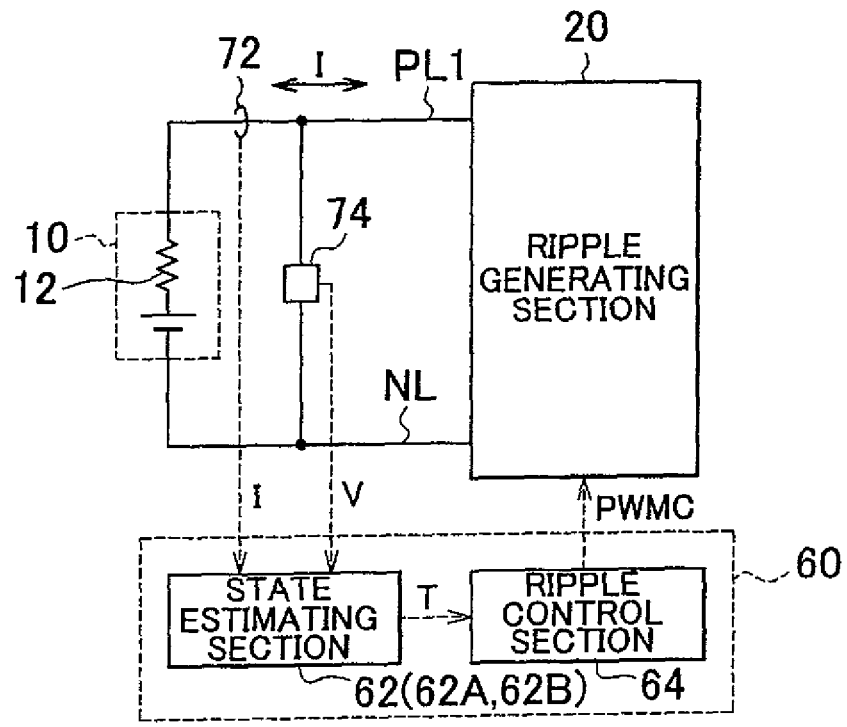
FIG. 2 is a diagram showing a system configuration of part of the electric vehicle shown in FIG. 1, the part relating to ripple temperature increase operation on the secondary battery.

FIG. 2 is a diagram showing a system configuration of part of the electric vehicle 100 shown in FIG. 1, the part relating to the ripple temperature increase operation on the secondary battery 10. Referring to FIG. 2, the secondary battery 10 includes an internal resistance 12. The internal resistance 12 has a temperature dependence and significantly varies depending also on the frequency of the electric current that flows in the battery as described later.

The ripple generating section 20 is, as described above, formed of the boost converter 22 and the capacitor CH shown in FIG. 1 (not shown in FIG. 2). In the ripple generating section 20, the switching devices Q1 and Q2 (not shown in FIG. 2) are complementarily turned on and off according to the control signal PWMC from the ECU 60, whereby the ripple generating section 20 generates the ripple current depending on the switching frequencies of the switching devices Q1 and Q2.

The ECU 60 includes a state estimating section 62 and a ripple control section 64. The state estimating section 62 estimates the temperature T of the secondary battery 10 based on the values of the electric current I and the voltage V detected when the ripple generating section 20 causes the ripple current to flow in the secondary battery 10. More specifically, the state estimating section 62 estimates the impedance of the secondary battery 10 based on the detected values of the electric current I and the voltage V and estimates the temperature T of the secondary battery 10 based on the estimated impedance with the use of the map prepared in advance that defines the relation between the temperature and the impedance of the secondary battery 10. The state estimating section 62 then outputs the estimate of the temperature T to the ripple control section 64.

The ripple control section 64 controls the ripple generating section 20 so as to increase the temperature of the secondary battery 10 from the inside thereof by causing the ripple current to flow in the secondary battery 10, based on the temperature T of the secondary battery 10 received from the state estimating section 62. The ripple control section 64 controls the ripple generating section 20 so as to cause the ripple current at a frequency within the range, in which the absolute value of the impedance of the secondary battery 10 is relatively reduced, to flow in the secondary battery 10, based on the frequency characteristics of the impedance of the secondary battery 10.

A brief description of the ripple temperature increase operation will be provided below and then, the configuration of the state estimating section 62 that estimates the temperature of the secondary battery 10 will be described in detail.

(Brief Description of Ripple Temperature Increase Operation)

Figure 3:
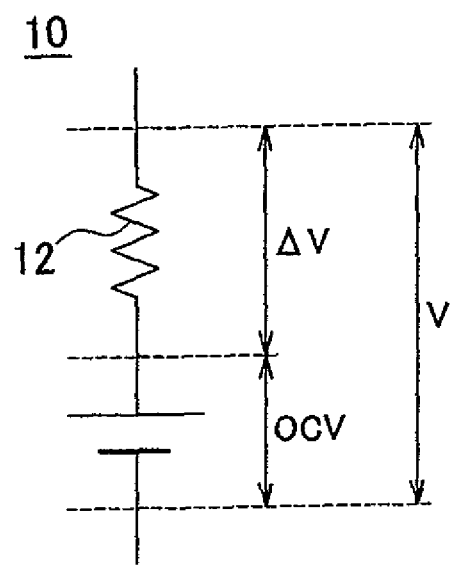
FIG. 3 is a diagram showing a breakdown of the voltage of the secondary battery.

FIG. 3 is a diagram showing a breakdown of the voltage of the secondary battery 10. In FIG. 3, for the sake of simplicity, the internal resistance has the real part only and there is no imaginary part caused by L, C etc. Referring to FIG. 3, the voltage V generated between the terminals of the secondary battery 10 is obtained by adding or subtracting a voltage ΔV, generated across the internal resistance 12 during energization, to or from an open-circuit voltage OCV. Specifically, V=OCV+ΔV when the charging electric current flows, and V=OCV−ΔV when the discharging electric current flows (ΔV>0).

When the resistance value of the internal resistance 12 is R, the amount of heat Q generated when an electric current I flows in the secondary battery 10 is expressed by the following equation:

$$Q = I^2 \times R \quad (1)$$
$$= I \times \Delta V \quad (2)$$
$$= \Delta V^2 / R \quad (3)$$

These equations (1) to (3) are equivalent to each other. According to the equation (1), it seems that the temperature of the secondary battery 10 is effectively increased by increasing the ripple current I generated with the use of the ripple generating section 20. In actuality, however, with regard to the voltage V of the secondary battery 10, it is required to conform to the upper and lower limit voltage in view of the safety and the durability. In particular, under extremely low temperature conditions, the resistance value R of the internal resistance 12 increases and the voltage ΔV therefore increases, so that there is a possibility that a situation occurs where it becomes impossible to cause a sufficient ripple current I for generating heat to flow while the voltage V of the secondary battery 10 is restrained within the range between the upper and lower limits.

Specifically, under low temperature conditions (especially under extremely low temperature conditions), in which the resistance value R of the internal resistance 12 increases, there is a possibility that a situation occurs where the voltage ΔV becomes a restriction and makes it impossible to cause the ripple current I to flow in the secondary battery 10, which prevents the temperature of the secondary battery 10 from being effectively increased. Thus, focus is put on the equation (3) and the frequency characteristics of the impedance of the secondary battery 10 and the ripple current at a frequency within the range, in which the absolute value of the impedance of the secondary battery 10 (resistance value R of the internal resistance 12) is relatively lower as compared to the absolute value of the same impedance in the case of the frequency out of this range, is caused to flow by the ripple generating section 20. In this way, the heat generation amount Q in the secondary battery 10 increases and it becomes possible to effectively increase the temperature of the secondary battery 10.

Figure 4:
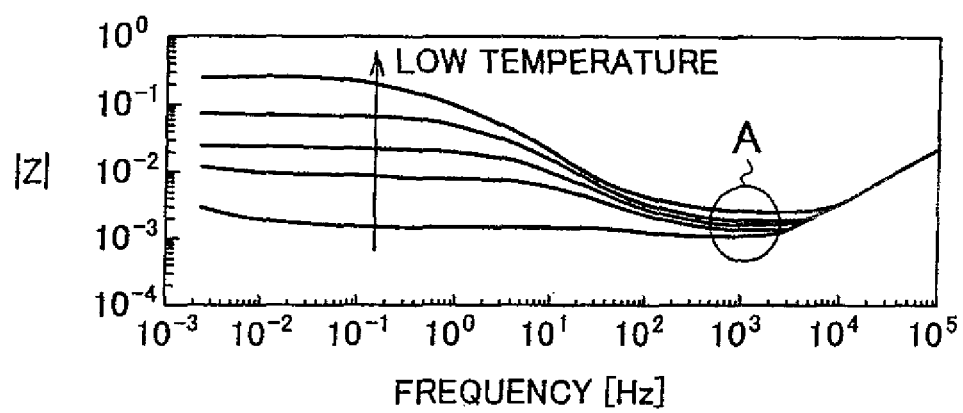
FIG. 4 is a Bode diagram showing impedance characteristics (absolute value) of the secondary battery.
Figure 5:
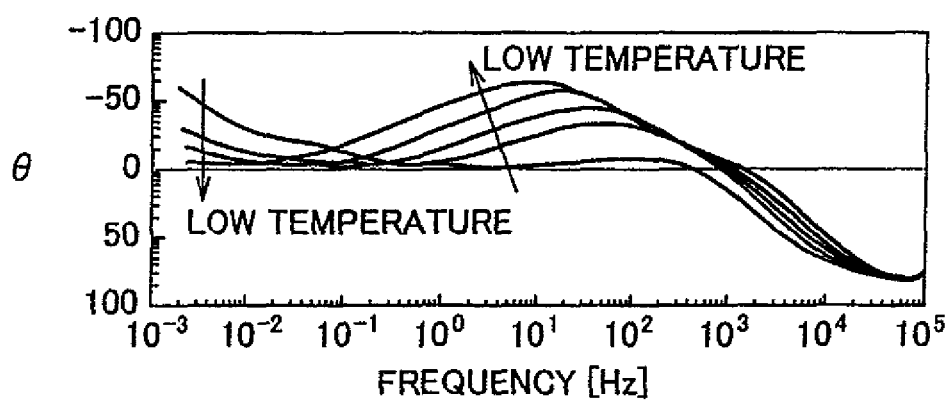
FIG. 5 is a Bode diagram showing impedance characteristics (phase) of the secondary battery.

FIGS. 4 and 5 are Bode diagrams showing the impedance characteristics of the secondary battery 10. As a method of analyzing the electrical characteristics of the secondary battery, the electrochemical impedance spectroscopy (EIS) is known. The Bode diagrams show the impedance characteristics of the secondary battery 10 with the use of the EIS. FIG. 4 shows the frequency characteristics of the absolute value |Z| of the impedance Z. FIG. 5 shows the frequency characteristics of the phase θ of the impedance Z.

In FIGS. 4 and 5, the horizontal axis, which is graduated logarithmically, indicates the frequency of the alternating current (ripple current) generated in the secondary battery 10. The vertical axis, which is graduated logarithmically, indicates the absolute value |Z| of the impedance Z in FIG. 4. The vertical axis indicates the phase θ of the impedance Z in FIG. 5.

As shown in FIG. 4, under low temperature conditions, in which it is required to increase the temperature of the secondary battery 10, the absolute value |Z| of the impedance Z increases as compared to that under non-low temperature conditions. However, such increase is significant when the frequency of the ripple current is low. In particular, around the frequency of 1 kHz, the absolute value |Z| of the impedance Z is smaller than that when the frequency is away from such a frequency range (around 1 kHz). In addition, even under extremely low temperature conditions, the absolute value is at most three times as high as that under the non-low temperature conditions (at room temperature, for example) (portion A in FIG. 4). In addition, as shown in FIG. 5, in such a frequency range (around 1 kHz), the phase θ of the impedance Z is near zero and therefore, the power factor is 1, which means good efficiency.

Thus, based on the frequency characteristics of the impedance of the secondary battery 10, the ripple current at a frequency within the range (around 1 kHz based on FIG. 4, for example), in which the absolute value of the impedance Z of the secondary battery 10 is relatively low, is generated by the ripple generating section 20. In this way, it is possible to effectively cause the ripple current to flow in the secondary battery 10 even under the restriction imposed by the voltage ΔV generated across the internal resistance 12 of the secondary battery 10, so that the temperature of the secondary battery 10 is effectively increased.

Figure 6:
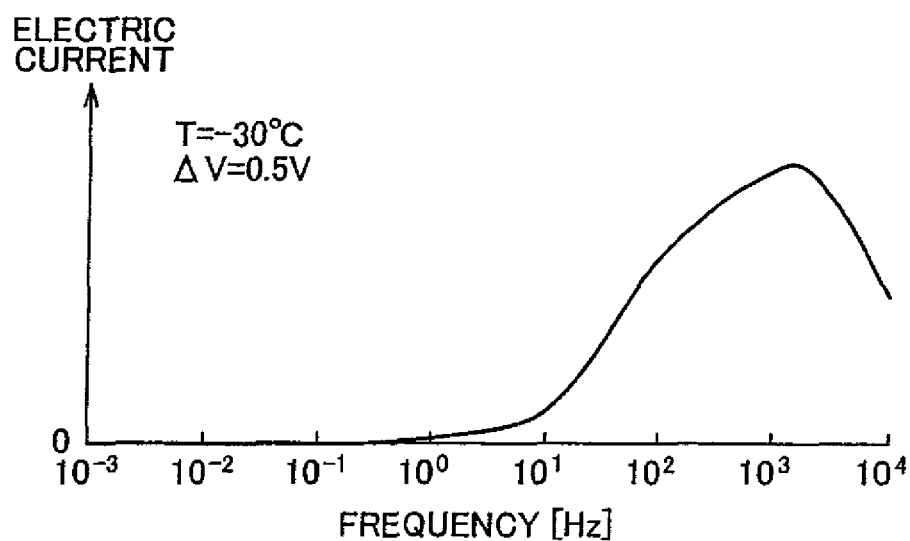
FIG. 6 is a diagram showing a peak value of a ripple current that can be caused to flow in the secondary battery under extremely low temperature conditions, where the voltage generated across an internal resistance of the secondary battery is a constraint.

FIG. 6 is a diagram showing the peak value of the ripple current that can be caused to flow in the secondary battery 10 under extremely low temperature conditions, where the voltage ΔV generated across the internal resistance 12 of the secondary battery 10 is a constraint. Referring to FIG. 6, the horizontal axis indicates the frequency of the ripple current and the vertical axis indicates the peak value of the ripple current (assumed to be sinusoidal) that can be caused to flow in the secondary battery 10 under the constraint of the voltage ΔV. Note that a case is shown by way of example, in which the voltage ΔV equals 0.5V, and the temperature T of the secondary battery 10 equals −30° C. (extremely low temperature).

As shown in FIG. 6, within the frequency range (around 1 kHz), in which the absolute value of the impedance of the secondary battery 10 is relatively small, the electric current that can be caused to flow in the secondary battery 10 increases. When the frequency is low or the electric current is a direct current, it is hardly possible to cause an electric current to flow in the secondary battery 10 to increase the temperature of the secondary battery.

Figure 7:
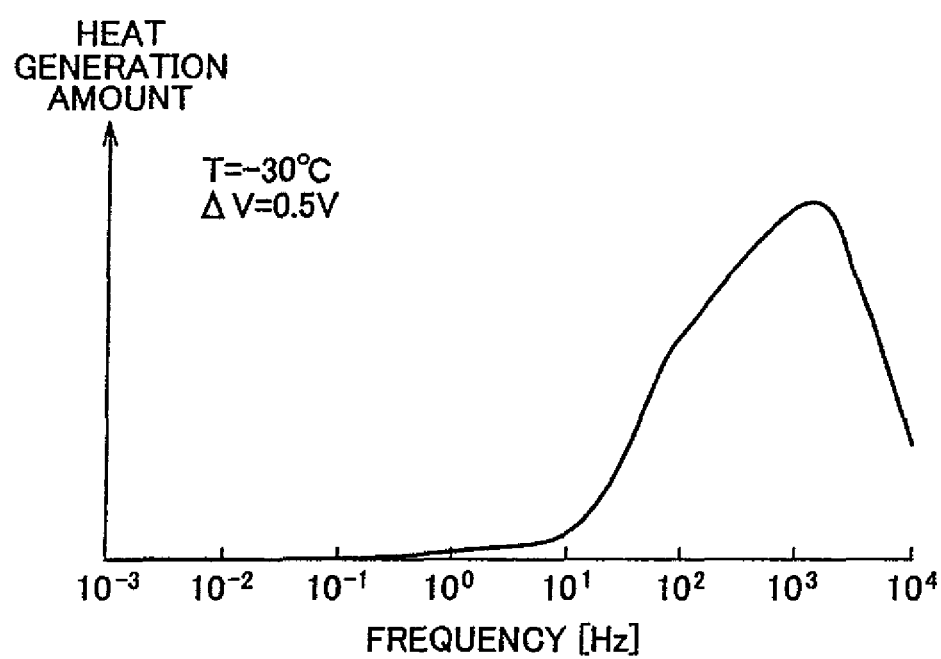
FIG. 7 is a diagram showing an average amount of heat that can be generated in the secondary battery under extremely low temperature conditions, where the voltage generated across the internal resistance of the secondary battery is a constraint.

FIG. 7 is a diagram showing the average amount of heat that can be generated in the secondary battery 10 under extremely low temperature conditions where the voltage ΔV generated across the internal resistance 12 of the secondary battery 10 is a constraint. Referring to FIG. 7, the horizontal axis indicates the frequency of the ripple current and the vertical axis indicates the average amount of heat generated in the secondary battery 10 in one cycle of the ripple. Note that also in FIG. 7, a case is shown by way of example, in which the voltage ΔV equals 0.5V, and the temperature T of the secondary battery 10 equals −30° C. (extremely low temperature).

As shown in FIG. 7, the amount of heat generated by the secondary battery 10 increases within a frequency range (around 1 kHz), in which the absolute value of the impedance of the secondary battery 10 is relatively low. When the frequency is low or the electric current is a direct current, it is hardly possible to cause an electric current to flow in the secondary battery 10 to increase the temperature of the secondary battery under the constraint, voltage ΔV=0.5 V.

As described above, based on the frequency characteristics of the impedance of the secondary battery 10, the ripple current at a frequency within the range (around 1 kHz, for example), in which the absolute value of the impedance of the secondary battery 10 is relatively low, is caused to flow by the ripple generating section 20. In this way, it is possible to increase the heat generation amount Q of the secondary battery 10 and it is possible to effectively increase the temperature of the secondary battery 10.

Figure 8:
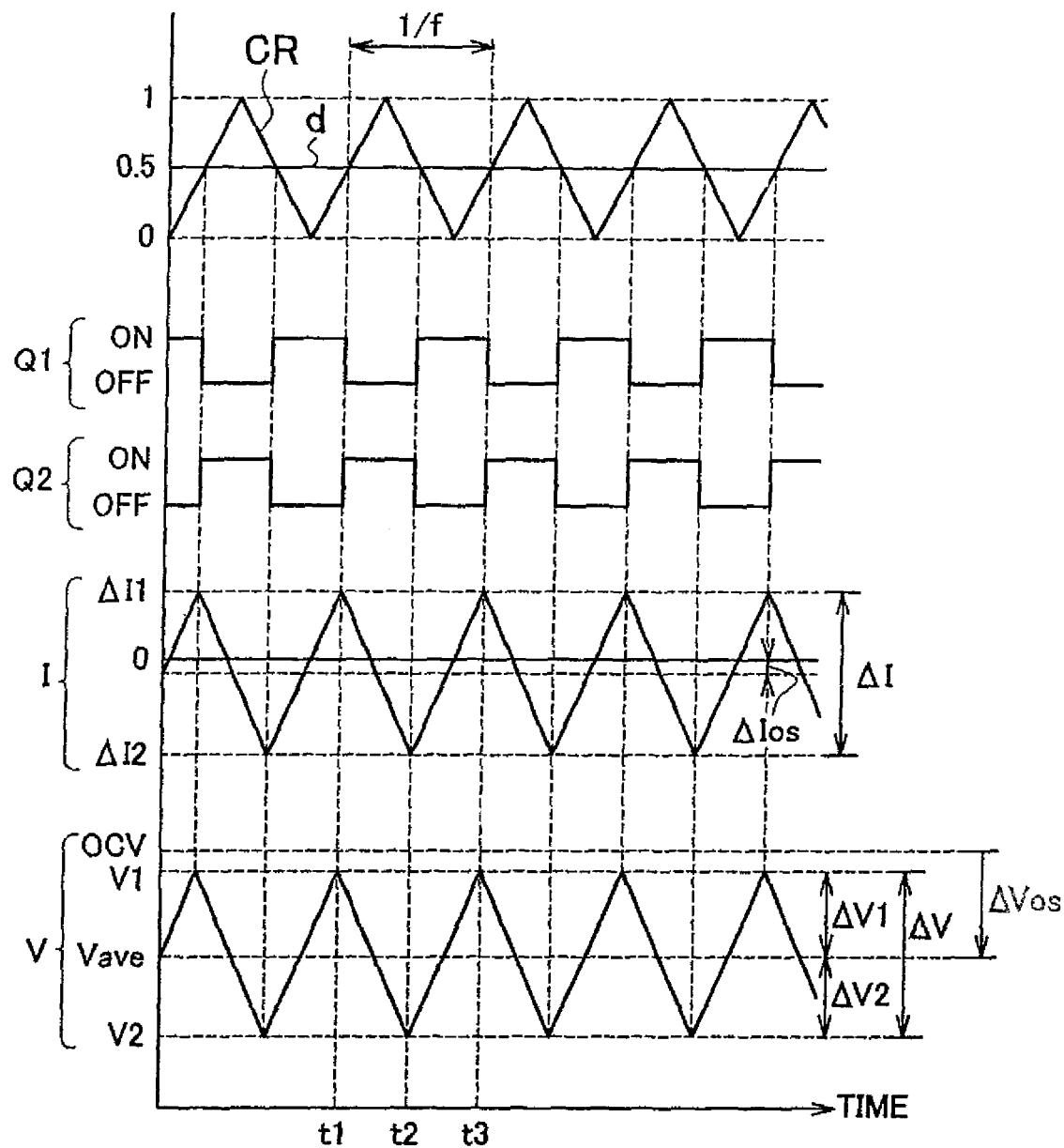
FIG. 8 is a waveform diagram of electric current and voltage in the secondary battery during the ripple temperature increase operation.

FIG. 8 is a waveform diagram of the electric current I and the voltage V in the secondary battery 10 during the ripple temperature increase operation. Referring to FIG. 8, during the ripple temperature increase operation, the frequency of a carrier signal CR of the ripple generating section 20 (boost converter 22) is set to a ripple frequency f (around 1 kHz, for example). When the carrier signal CR exceeds a duty command value d(=0.5) at time t1, the switching device Q1 of the upper arm is turned off and the switching device Q2 of the lower arm is turned on. When this occurs, the electric current I (positive when the battery is being charged) that flows in the secondary battery 10 is reversed and increased in the negative direction. At the timing when the energy stored in the reactor L has been discharged, the sign of the electric current I is turned from positive to negative. The voltage V is reduced.

When the carrier signal CR falls below the duty command value d at time t2, the switching device Q1 of the upper arm is turned on and the switching device Q2 of the lower arm is turned off. Then, the electric current I is reversed and increased in the positive direction. At the timing when the energy stored in the reactor L has been discharged, the sign of the electric current I is turned from negative to positive. The voltage V increases.

When the carrier signal CR again exceeds the duty command value d at time t3, the switching devices Q1 and Q2 are turned off and on, respectively. The electric current I is again reversed and increased in the negative direction and the voltage V is reduced. In this way, the electric current I and the voltage V vary at the ripple frequency f.

(Estimation of Temperature of Secondary Battery 10)

Next, a method of estimating the temperature of the secondary battery 10 with the use of the data measured during the ripple temperature increase operation will be described. First, some parameters to be used in a calculation for estimating the temperature of the secondary battery 10 are defined with the use of the waveform diagram shown in FIG. 8.

When it is assumed that the positive-side peak value of the electric current I is a charging maximum electric current $\Delta I1$ (>0) and the negative-side peak value of the electric current I is a discharging maximum electric current $\Delta I2$ (<0), the amplitude of the electric current I, that is, the amplitude $\Delta I$ of the ripple current is expressed by the following equation:

$$\Delta I = \Delta I1 - \Delta I2 \tag{4}$$

Because a loss occurs in the ripple generating section 20 (boost converter 22), the average value of the electric current I is offset to the discharge side. When the amount of offset is $\Delta Ios$, the offset electric current $\Delta Ios$ can be expressed by the following equation:

$$\Delta Ios = (\Delta I1 + \Delta I2)/2 \tag{5}$$

When a maximum peak value of the voltage V is a maximum voltage V1 and a minimum peak value of the voltage V is a minimum voltage V2, the amplitude of the voltage V, that is, the amplitude $\Delta V$ of the ripple voltage can be expressed by the following equation:

$$\Delta V = V1 - V2 \tag{6}$$

An average value Vave of the voltage V and an amplitude $\Delta V1$ on the charge side and an amplitude $\Delta V2$ on the discharge side with respect to the average value Vave can be expressed by the following equations:

$$Vave = (V1+V2)/2 \tag{7}$$

$$\Delta V1 = V1 - Vave \tag{8}$$
$$= (V1 - V2)/2$$
$$= \Delta V2$$

When an electric current flows in the secondary battery 10, the average value Vave of the voltage V is offset from the open-circuit voltage OCV of the secondary battery 10. When the offset amount is $\Delta Vos$, the offset voltage $\Delta Vos$ can be expressed by the following equation:

$$\Delta Vos = OCV - Vave = OCV - (V1+V2)/2 \tag{9}$$

Figure 9:
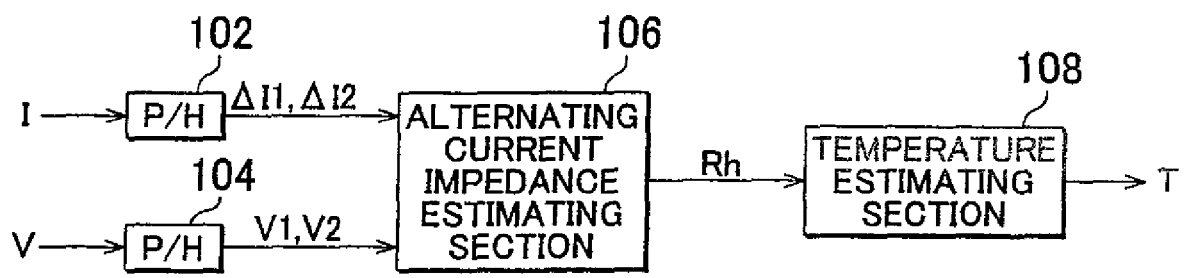
FIG. 9 is a functional block diagram of a state estimating section shown in FIG. 2.

FIG. 9 is a functional block diagram of the state estimating section 62 shown in FIG. 2. Referring to FIG. 9, the state estimating section 62 includes peak hold circuits 102 and 104, an alternating current impedance-estimating section 106, and a temperature estimating section 108.

The peak hold circuit 102 receives the detected value of the electric current I from the electric current sensor 72 (FIG. 2). The peak hold circuit 102 holds the peak values of the electric current I to output the charging maximum electric current $\Delta I1$ and the discharging maximum electric current $\Delta I2$ (FIG. 8). The peak hold circuit 104 receives the detected value of the voltage V from the voltage sensor 74 (FIG. 2). The peak hold circuit 104 holds the peak values of the voltage V to output the maximum voltage V1 and the minimum voltage V2 (FIG. 8). Note that as the peak hold circuits 102 and 104, publicly available circuits are used, in which the time constant or the reset interval is set equal to or greater than a few dozen seconds, for example.

The alternating current impedance-estimating section 106 estimates the alternating current impedance Rh of the secondary battery 10 at the ripple frequency, based on the charging maximum electric current $\Delta I1$ and the discharging maximum electric current $\Delta I2$ received from the peak hold circuit 102 and on the maximum voltage V1 and the minimum voltage V2 received from the peak hold circuit 104 when the ripple current is caused to flow in the secondary battery 10 by the ripple generating section 20 (FIG. 2). Specifically, the alternating current impedance-estimating section 106 estimates an alternating current impedance Rh with the use of one of the following equations:

$$Rh = \Delta V/\Delta I \tag{10}$$

$$Rh = \Delta V1/\Delta I1 \tag{11}$$

$$Rh = \Delta V2/\Delta I2 \tag{12}$$

Note that $\Delta V$, $\Delta I$, $\Delta V1$ ($\Delta V2$) are calculated based on the above equations (6), (4), and (8), respectively. The alternating current impedance-estimating section 106 outputs the estimated alternating current impedance Rh to the temperature estimating section 108.

The temperature estimating section 108 estimates the temperature T of the secondary battery 10 based on the alternating current impedance Rh received from the alternating current impedance-estimating section 106. More specifically, the temperature estimating section 108 estimates the temperature T of the secondary battery 10 based on the alternating current impedance Rh estimated by the alternating current impedance-estimating section 106 with the use of the map, prepared in advance, that defines the relation between the temperature of the secondary battery 10 and the alternating current impedance of the secondary battery 10 at the ripple frequency.

The map showing the relation between the temperature of the secondary battery 10 and the alternating current impedance of the secondary battery 10 at the ripple frequency is generated based on the impedance characteristics of the secondary battery 10 shown in FIG. 4, for example. Specifically, the portion A in FIG. 4 shows the relation between the temperature and the impedance at the ripple frequency. The above map can be created by extracting data of this portion from the Bode diagram of FIG. 4.

As described above, in the first embodiment, with the use of the ripple generating section 20, the ripple current is caused to flow in the secondary battery 10 to increase the temperature of the secondary battery 10. Based on the electric current I and the voltage V of the secondary battery 10 that occur when the ripple current is caused to flow in the secondary battery 10, the alternating current impedance Rh of the secondary battery 10 at the ripple frequency is estimated. Then, the temperature of the secondary battery 10 is estimated based on the estimated alternating current impedance Rh with the use of the relation, obtained in advance, between the temperature of the secondary battery 10 and the alternating current impedance at the ripple frequency. Thus, according to the first embodiment, it is possible to accurately estimate the temperature of the secondary battery 10 without using a temperature sensor.

(Second Embodiment)

In the above first embodiment, the alternating current impedance Rh of the secondary battery 10 at the ripple frequency is estimated and the temperature T of the secondary battery 10 is estimated based on the estimated alternating current impedance Rh. In a second embodiment, however, the direct-current resistance of the secondary battery 10 is estimated and the temperature of the secondary battery 10 is estimated based on the estimated direct-current resistance.

An overall configuration of a system according to the second embodiment is the same as the system shown in FIGS. 1 and 2.

Figure 10:
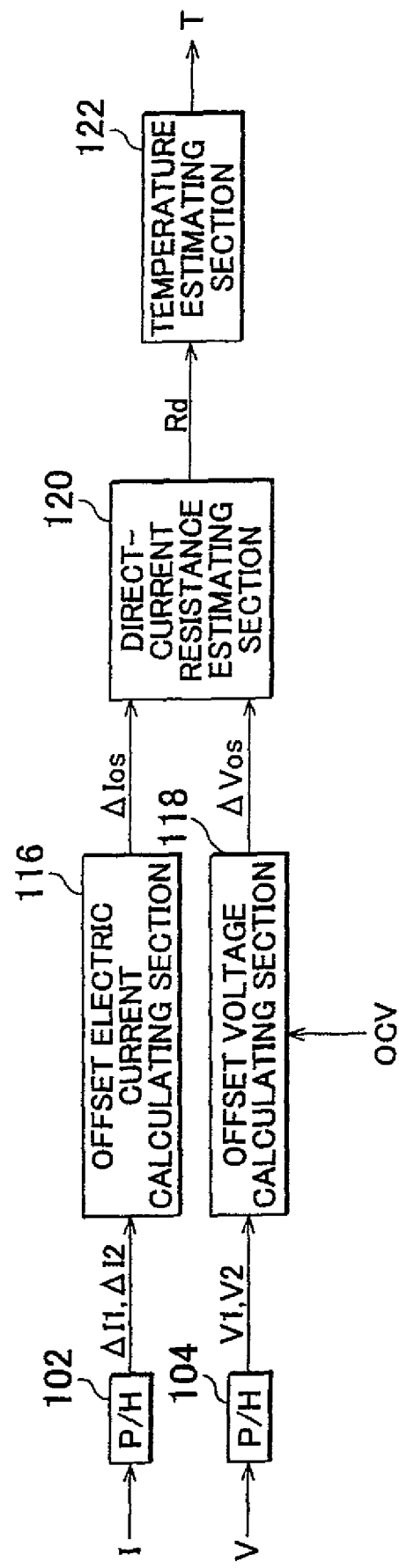
FIG. 10 is a functional block diagram showing a state estimating section of a second embodiment.

FIG. 10 is a functional block diagram showing a state estimating section 62A of the second embodiment. Referring to FIG. 10, the state estimating section 62A includes the peak hold circuits 102 and 104, an offset electric current calculating section 116, an offset voltage calculating section 118, a direct-current resistance estimating section 120, and a temperature estimating section 122.

The offset electric current calculating section 116 calculates the offset electric current ΔIos with the use of the above equation (5) based on the charging maximum electric current ΔI1 and the discharging maximum electric current ΔI2 received from the peak hold circuit 102 when the ripple current is caused to flow in the secondary battery 10 by the ripple generating section 20 (FIG. 2).

The offset voltage calculating section 118 calculates the offset voltage ΔVos with the use of the above equation (9) based on the maximum voltage V1 and the minimum voltage V2 received from the peak hold circuit 104 when the ripple current is caused to flow in the secondary battery 10 by the ripple generating section 20.

The direct-current resistance estimating section 120 estimates a direct-current resistance Rd of the secondary battery 10 based on an offset electric current ΔIos calculated by the offset electric current calculating section 116 and an offset voltage ΔVos calculated by the offset voltage calculating section 118. Specifically, the direct-current resistance estimating section 120 estimates the direct-current resistance Rd with the use of the following equation:

$$Rd = \Delta Vos / |\Delta Ios| \quad (13)$$

The temperature estimating section 122 estimates the temperature T of the secondary battery 10 based on the direct-current resistance Rd estimated by the direct-current resistance estimating section 120. More specifically, the temperature estimating section 122 estimates the temperature T of the secondary battery 10 based on the direct-current resistance Rd received from the direct-current resistance estimating section 120 with the use of the map prepared in advance that defines the relation between the temperature of the secondary battery 10 and the direct-current resistance of the secondary battery 10.

The map that defines the relation between the temperature of the secondary battery 10 and the direct-current resistance of the secondary battery 10 is created based on the impedance characteristics of the secondary battery 10 shown in FIG. 4, for example. Specifically, it can be said that the extremely low frequency region in FIG. 4 substantially shows the relation between the temperature and the impedance in the case of the direct current and therefore, by extracting the data in the extremely low frequency region from FIG. 4, the above map is created.

As described above, in the second embodiment, the direct-current resistance Rd of the secondary battery 10 is estimated based on the offset electric current ΔIos and the offset voltage ΔVos when the ripple current is caused to flow in the secondary battery 10. Then, the temperature of the secondary battery 10 is estimated based on the estimated direct-current resistance Rd with the use of the relation between the temperature and the direct-current resistance of the secondary battery 10, the relation being obtained in advance. Thus, the second embodiment also makes it possible to accurately estimate the temperature of the secondary battery 10 without using a temperature sensor.

In addition, as can be seen from FIG. 4, the impedance in the extremely low frequency region is more temperature dependent than the impedance at the ripple frequency, which is a high frequency. Thus, there is a possibility that the temperature of the secondary battery 10 can be estimated with higher accuracy.

(Third Embodiment)

In a third embodiment, the energy loss in the secondary battery 10 due to the ripple temperature increase operation is estimated and the temperature of the secondary battery 10 is estimated based on the estimated energy loss.

An overall configuration of a system according to the third embodiment is the same as the system shown in FIGS. 1 and 2.

Figure 11:
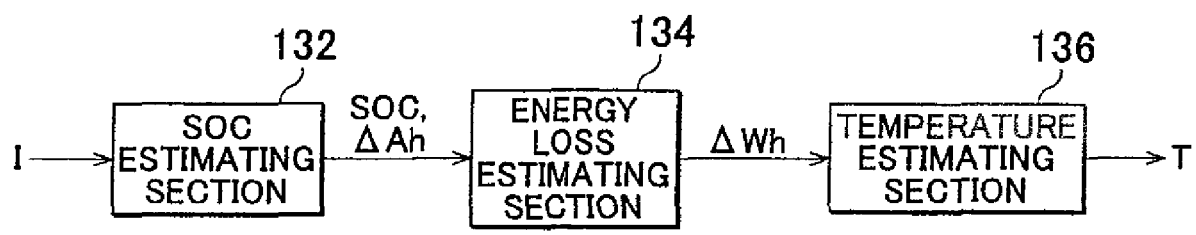
FIG. 11 is a functional block diagram of a state estimating section of a third embodiment.

FIG. 11 is a functional block diagram of a state estimating section 63B of the third embodiment. Referring to FIG. 11, the state estimating section 62B includes an SOC estimating section 132, an energy loss estimating section 134, and a temperature estimating section 136.

The SOC estimating section 132 estimates the remaining capacity (hereinafter also referred to as the "SOC", which is the abbreviation of "state of charge") of the secondary battery 10 when the ripple current is caused to flow in the secondary battery 10 by the ripple generating section 20 (FIG. 2).

Figure 12:
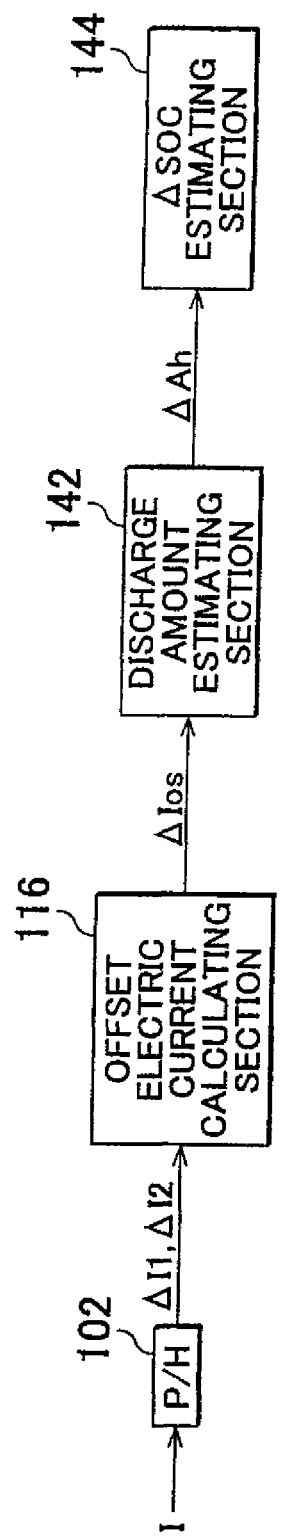
FIG. 12 is a more detailed, functional block diagram showing a state of charge (SOC) estimating section shown in FIG. 11.

FIG. 12 is a more detailed, functional block diagram showing the SOC estimating section 132 shown in FIG. 11. Referring to FIG. 12, the SOC estimating section 132 includes the peak hold circuit 102, the offset electric current calculating section 116, a discharge amount estimating section 142, and a ΔSOC estimating section 144.

The discharge amount estimating section 142 estimates a discharge amount ΔAh during ripple temperature increase operation by integrating the offset electric current ΔIos calculated by the offset electric current calculating section 116.

$$\Delta Ah = \int (\Delta Ios) dt \quad (14)$$

The ΔSOC estimating section 144 estimates the amount of variation ΔSOC of SOC during the ripple temperature increase operation by dividing the discharge amount ΔAh estimated by the discharge amount estimating section 142 by the capacity C of the secondary battery 10.

$$\Delta SOC = \Delta Ah / C \quad (15)$$

Then, the SOC of the secondary battery 10 is calculated by adding the estimated variation amount ΔSOC of the SOC to the SOC before the ripple temperature increase operation is performed.

Referring again to FIG. 11, the SOC estimating section 132 outputs, to the energy loss estimating section 134, the estimated SOC and the discharge amount ΔAh during the ripple temperature increase operation that is estimated in the course of calculation.

The energy loss estimating section 134 estimates the OCV of the secondary battery 10 based on the SOC estimated by the SOC estimating section 132 with the use of an SOC-OCV (open-circuit voltage) map prepared in advance. Then, the energy loss estimating section 134 estimates the energy loss ΔWh of the secondary battery 10 accompanying the ripple temperature increase operation based on both the OCV estimated based on the SOC estimated by the SOC estimating section 132 and the discharge amount ΔAh estimated by the SOC estimating section 132 because the product of the OCV and the discharge amount ΔAh corresponds to the energy loss ΔWh of the secondary battery 10 accompanying the ripple temperature increase operation.

The temperature estimating section 136 estimates the temperature T of the secondary battery 10 based on the energy loss ΔWh estimated by the energy loss estimating section 134. More specifically, the temperature estimating section 136 estimates the temperature variation amount ΔT of the secondary battery 10 by dividing the energy loss ΔWh by the heat capacity of the secondary battery 10 and multiplying the resultant value by an efficiency η. Then, the estimated temperature variation amount ΔT is added to the temperature before the ripple temperature increase operation is performed, whereby the temperature T of the secondary battery 10 is estimated.

As described above, in the third embodiment, the SOC of the secondary battery 10 is estimated based on the electric current I of the secondary battery 10 during the ripple temperature increase operation, and the energy loss ΔWh of the secondary battery 10 is estimated based on the estimated SOC. Subsequently, the temperature of the secondary battery 10 is estimated by estimating the amount of change in the temperature of the secondary battery 10 based on the estimated energy loss ΔWh. Thus, the third embodiment also makes it possible to accurately estimate the temperature of the secondary battery 10 without using a temperature sensor.

(Fourth Embodiment)

For the purpose of measuring the charging maximum electric current ΔI1 and the discharging maximum electric current ΔI2, as well as the maximum voltage V1 and the minimum voltage V2 of the secondary battery 10 during the ripple temperature increase operation, in which the temperature of the secondary battery 10 is increased by causing the ripple current at a frequency of approximately 1 kHz to flow, using a peak hold circuit used in the above embodiments or using a high-speed sensor is an easy way, which however leads to an increase of costs. Thus, in a fourth embodiment, a method of accurately measuring the charging maximum electric current ΔI1 and the charging minimum electric current ΔI2, as well as the maximum voltage V1 and the minimum voltage V2 with the use of the conventional voltage sensor and the conventional electric current sensor, such as sensors whose sampling period is about 10 milliseconds.

Figure 13:
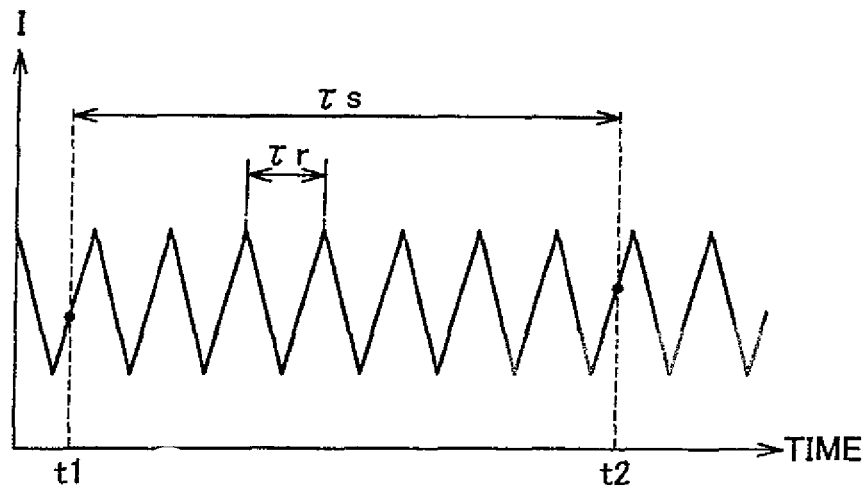
FIG. 13 is a diagram showing the relation between the period of ripple current and the sampling period of a sensor.

FIG. 13 is a diagram showing the relation between the period of the ripple current and the sampling period of the sensor. Although, in the following description, the electric current sensor will be representatively described, the description also applies to the voltage sensor. Referring to FIG. 13, the period τr is the period of the ripple current and the period τs is the electric current sampling period of the electric current sensor.

The time τa is defined as follows:

$$\tau s = \tau r \times N + \tau a \quad (16)$$

where 0<τa<τr and N is a natural number. The time τa will be described with the use of FIG. 14.

Figure 14:
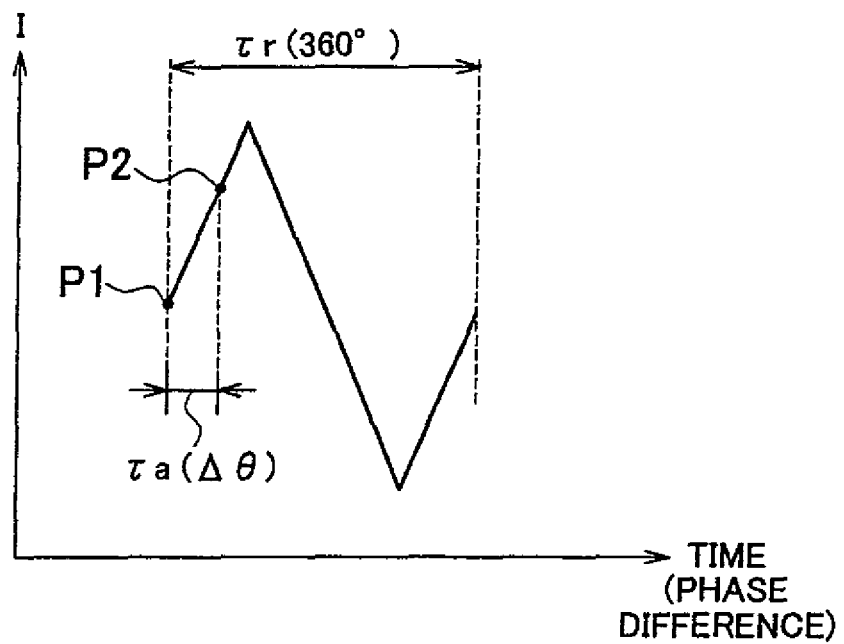
FIG. 14 is a diagram, in which a ripple waveform of one period after a sampling at a certain time and a ripple waveform of the same phase after N periods, are superimposed on each other.

FIG. 14 is a diagram, in which a ripple waveform of one period after a sampling at a certain time and a ripple waveform of the same phase after N periods are superimposed on each other. Referring to FIG. 14, the point P1 is a sampling point at a certain time and the point P2 is a subsequent sampling point. The interval between the point P1 and the point P2 is the time τa defined by the equation (16). The phase difference Δθ between the point P1 and the point P2 on the ripple waveform is expressed by the following equation:

$$\Delta\theta = \tau a/\tau r \times 360° \quad (17)$$

Figure 15:
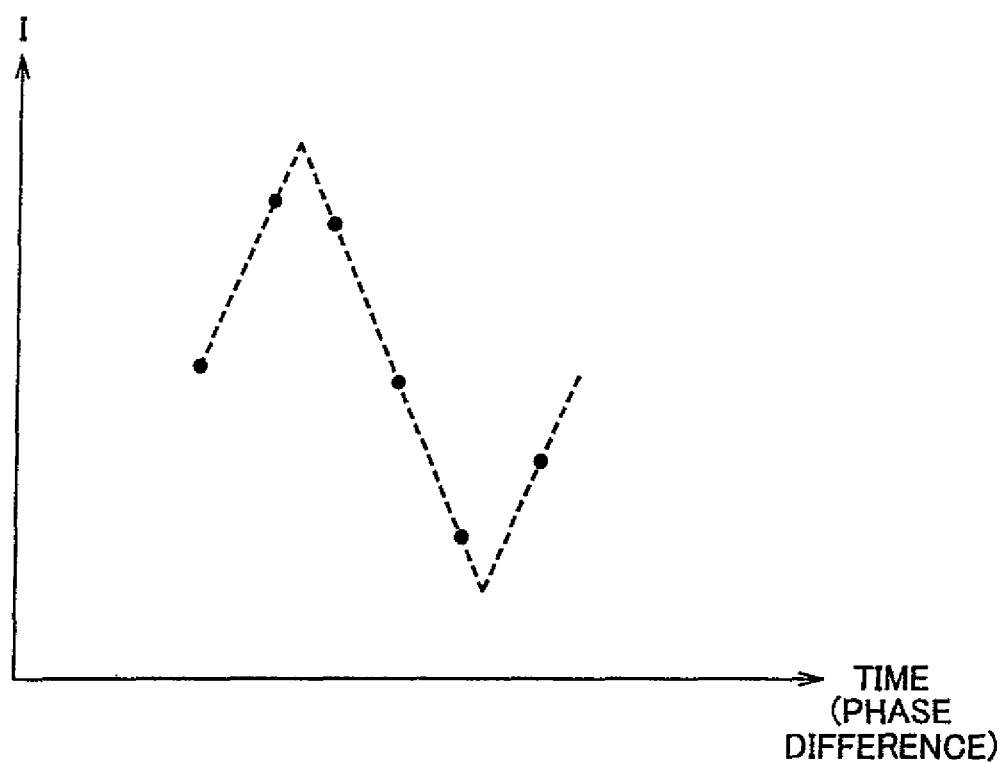
FIG. 15 is a diagram, in which a plurality of sampling points are plotted.

When the time τa or the phase difference Δθ is calculated with the use of the equations (16) and (17), based on the sampling period τs and the ripple period τr that are known in advance, and the sampling points are sequentially plotted while shifting the time τa or the phase Δθ from that of the preceding sampling point, the data as shown in FIG. 15 is obtained. The shape of the ripple waveform (triangular waveform or sawtooth waveform) is determined in advance based on the configuration of the ripple generating section 20 and the control performed by the ripple generating section 20 and therefore, the ripple waveform is estimated based on the data shown in FIG. 15. Based on the estimated ripple waveform, it is possible to calculate the charging maximum electric current ΔI1 and the discharging maximum electric current ΔI2, as well as the maximum voltage V1 and the minimum voltage V2.

The shorter the time τa is as compared to the ripple period τr, the shorter the intervals of acquisition of data shown in FIG. 15 can be set. In this case, however, the time taken to acquire the data of one period of the ripple waveform increases. Thus, the number of data M that are acquired during one period of the ripple waveform may be determined according to the predetermined, desired accuracy and the relation between the ripple period τr and the time τa may be determined with the use of the following equation to set the ripple period τr and/or the sampling period τs with the use of the above equation (16).

$$\tau r/\tau a = M \text{ and a reminder of } L \quad (18)$$

where M is a natural number and 0≤L<1.

When the relation between the ripple period τr and the time τa is defined based on the equation (18), a time period of (τs×M) is required to acquire the data of the one period of ripple waveform. The time period (that is, the value of M) is determined based on the required accuracy depending on the battery, that is, for example, the cycle of detection of the voltage overrun and underrun, the overcurrent, etc. in the secondary battery 10 and the cycle of control thereof.

When L is zero in the equation (18), the sampling at the same phase point is performed after M samplings are performed. In order to more accurately estimate the ripple waveform, it is preferable that the phase of the sampling point be shifted after M samplings are performed. Thus, the equation (18) is modified to the following equation:

$$\tau r/\tau a = M \text{ and a reminder of } p/q \quad (19)$$

where p and q each are a natural number and p/q is an irreducible fraction.

In this way, it is possible to set the intervals, at which the sampling is again performed at the same phase point, to (τs×M×q). Thus, it is preferable that the ripple period τr and/or the sampling period τs be set so that q in the equation (19) is maximized. This makes it possible to increase the sampling points at different phases on the ripple waveform and therefore to increase the accuracy in estimating the ripple waveform.

In addition, by changing the sampling timing at intervals of (τs×M×q) seconds (or (τs×M) seconds) by an amount between 0 and τa seconds exclusive, it is possible to shift the phase of the sampling point after (τs×M×q) seconds (or (τs×M) seconds). The time period, by which the sampling timing is shifted, is set different from L×τa and is preferably different from the preceding shifting time period. Alternatively, the time period, by which the sampling timing is shifted, may be determined by a random number between 0 and τa exclusive.

As described above, according to the fourth embodiment, the charging maximum electric current ΔI1 and the discharging maximum electric current ΔI2, as well as the maximum voltage V1 and the minimum voltage V2 are accurately measured with the use of the conventional voltage sensor and the conventional electric current sensor, such as sensors whose sampling period is about 10 milliseconds. As a result, the estimation of the temperature of the secondary battery 10 can be performed at low costs.

In the above embodiments, the electric vehicle 100 may be an electric vehicle, in which the motor generator 40 is the only drive power source or may be a hybrid vehicle, on which an engine is additionally mounted as the drive power source. In addition, the electric vehicle 100 may be a fuel cell vehicle, on which a fuel cell in addition to the secondary battery 10 is mounted as the direct-current power source.

In the first to third embodiments, instead of the peak hold circuits 102 and 104, a means for selecting the maximum value and the minimum value of electric current values and voltage values sampled by an analog-digital converter circuit may be provided, for example.

The electric current sensor 72 and the peak hold circuit 102 are an example of the "electric current detecting section" of the invention. The voltage sensor 74 and the peak hold circuit 104 are an example of the "voltage detecting section" of the invention. The alternating current impedance-estimating section 106 is an example of the "impedance estimating section" of the invention. The peak hold circuits 102 and 104 are an example of the "peak value acquiring section" of the invention. The energy loss estimating section 134 is an example of the "loss estimating section" of the invention.

It should be understood that the embodiments described above are for illustration purpose only and not intended to be restrictive. The scope of the invention is defined not by the above description of the embodiments but by the claims and it is intended to include all modifications within the scope of the claims and the equivalent thereof.

The invention claimed is:

1. A secondary battery temperature-estimating apparatus for estimating a temperature of a secondary battery, comprising:
    a ripple generating section that is connected to the secondary battery, adapted to cause a ripple alternating current at a predetermined frequency to flow in the secondary battery, and configured to effectively increase the temperature of the secondary battery by setting the predetermined frequency to around 1 kHz;
    an electric current detecting section that detects an electric current charging or discharging the secondary battery;
    a discharge amount estimating section that estimates a discharge amount when the ripple current flows in the secondary battery;
    a state of charge (SOC) estimating section that estimates a state of charge (SOC) of the secondary battery by adding a variation amount of the state of charge estimated based on said estimated discharge amount to a state of charge before the ripple current flowed in the secondary battery;
    a loss estimating section that estimates an open-circuit voltage (OCV) of the secondary battery based on the state of charge thereof with the use of a SOC-OCV map prepared in advance, and estimates an energy loss of the secondary battery based on said estimated open-circuit voltage and said estimated discharge amount; and
    a temperature estimating section that estimates an amount of change in the temperature of the secondary battery based on the energy loss of the secondary battery estimated by the loss estimating section and estimates the temperature of the secondary battery by adding the estimated amount of change in the temperature to the temperature before the ripple current flowed in the secondary battery.

2. The secondary battery temperature-estimating apparatus according to claim 1, wherein
    the SOC estimating section includes: an offset electric current calculating section that calculates an offset electric current represented by an average value of the detected electric current, based on the electric current detected by the electric current detecting section when the ripple generating section causes the ripple current to flow in the secondary battery; a discharge amount estimating section that estimates an amount of discharge from the secondary battery obtained by integrating the offset electric current; and a change amount estimating section that estimates an amount of change in the SOC of the secondary battery by dividing the amount of discharge from the secondary battery estimated by the discharge amount estimating section by a capacity of the secondary battery.

3. The secondary battery temperature-estimating apparatus according to claim 1, wherein the electric current detecting section includes a peak value acquiring section that acquires a peak value of the detected value of the electric current.

4. A secondary battery temperature-estimating method of estimating a temperature of a secondary battery, comprising:
    causing a ripple alternating current at a predetermined frequency to flow in the secondary battery;
    setting the predetermined frequency to around 1 kHz to effectively increase the temperature of the secondary battery;
    detecting an electric current charging or discharging the secondary battery;
    estimating a discharge amount when the ripple current flows in the secondary battery;
    estimating a state of charge (SOC) of the secondary battery by adding a variation amount of the state of charge estimated based on said estimated discharge amount to a state of charge before the ripple current flowed in the secondary battery;
    estimating an open-circuit voltage (OCV) of the secondary battery based on the state of charge thereof with the use of a SOC-OCV map prepared in advance;
    estimating an energy loss of the secondary battery based on the said estimated open-circuit voltage and said estimated discharge amount; and
    estimating an amount of change in the temperature of the secondary battery based on the estimated energy loss of the secondary battery and estimating the temperature of the secondary battery by adding the estimated amount of change in the temperature to the temperature before the ripple current flowed in the secondary battery.

5. The secondary battery temperature-estimating method according to claim 4, wherein
    the estimating the SOC includes: calculating an offset electric current represented by an average value of the detected electric current, based on the electric current detected when the ripple current is caused to flow in the secondary battery; estimating an amount of discharge from the secondary battery obtained by integrating the offset electric current; and estimating an amount of change in the SOC of the secondary battery by dividing the estimated amount of discharge from the secondary battery by a capacity of the secondary battery.

* * * * *